United States Patent
Roy

(10) Patent No.: US 11,676,985 B2
(45) Date of Patent: Jun. 13, 2023

(54) IMAGE SENSOR INTENDED TO BE ILLUMINATED VIA A BACK SIDE, AND CORRESPONDING METHOD FOR ACQUIRING A LIGHT FLUX

(71) Applicant: STMicroelectronics (Crolles 2) SAS, Crolles (FR)

(72) Inventor: Francois Roy, Seyssin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 150 days.

(21) Appl. No.: 17/122,394

(22) Filed: Dec. 15, 2020

(65) Prior Publication Data
US 2021/0193708 A1    Jun. 24, 2021

(30) Foreign Application Priority Data
Dec. 18, 2019    (FR) ...................................... 1914700

(51) Int. Cl.
*H01L 27/146*    (2006.01)

(52) U.S. Cl.
CPC .... *H01L 27/1464* (2013.01); *H01L 27/14603* (2013.01); *H01L 27/14616* (2013.01)

(58) Field of Classification Search
CPC ........... H01L 27/1464; H01L 27/14603; H01L 27/14616; H01L 27/14607; H01L 27/14614; H01L 27/14638; H01L 27/14647; H04N 9/04563; H04N 25/17
See application file for complete search history.

(56) References Cited

U.S. PATENT DOCUMENTS

| | | | |
|---|---|---|---|
| 6,930,336 B1* | 8/2005 | Merrill | H01L 27/14647 257/292 |
| 9,793,312 B1* | 10/2017 | Roy | H01L 27/14643 |
| 2007/0131987 A1* | 6/2007 | Kim | H01L 27/14647 257/E27.131 |
| 2010/0193845 A1* | 8/2010 | Roy | H01L 27/1463 257/E27.15 |
| 2016/0056198 A1* | 2/2016 | Lee | H01L 27/1463 257/225 |
| 2016/0093659 A1* | 3/2016 | Nakamura | H01L 27/14627 257/225 |
| 2017/0353673 A1* | 12/2017 | Roy | H01L 27/14614 |

(Continued)

FOREIGN PATENT DOCUMENTS

| | | |
|---|---|---|
| EP | 3579275 A2 | 12/2019 |
| JP | 2009295937 A | 12/2009 |

OTHER PUBLICATIONS

INPI Search Report and Written Opinion for FR Appl. No. 1914700 dated Nov. 23, 2020 (8 pages).

*Primary Examiner* — Samuel Park
(74) *Attorney, Agent, or Firm* — Crowe & Dunlevy

(57) ABSTRACT

A back side illuminated image sensor includes a pixel formed by three doped photosensitive regions that are superposed vertically in a semiconductor substrate. Each photosensitive region is laterally framed by a respective vertical annular gate. The vertical annular gates are biased by a control circuit during an integration phase so as to generate an electrostatic potential comprising potential wells in the central portion of the volume of each doped photosensitive region and a potential barrier at each interface between two neighboring doped photosensitive regions.

30 Claims, 6 Drawing Sheets

(56) References Cited

U.S. PATENT DOCUMENTS

2018/0013961 A1\* 1/2018 Lee .................. H01L 27/14647
2018/0294305 A1 10/2018 Janssens et al.
2020/0403022 A1\* 12/2020 Jin .................... H01L 27/14612

\* cited by examiner

IMAGE SENSOR INTENDED TO BE ILLUMINATED VIA A BACK SIDE, AND CORRESPONDING METHOD FOR ACQUIRING A LIGHT FLUX

PRIORITY CLAIM

This application claims the priority benefit of French Application for Patent No. 1914700, filed on Dec. 18, 2019, the content of which is hereby incorporated by reference in its entirety to the maximum extent allowable by law.

TECHNICAL FIELD

Embodiments and modes of implementation of the invention relate to image sensors and, in particular, image sensors illuminated via a back side, and to methods for acquiring a light flux with this type of sensor.

BACKGROUND

The pixels of image sensors of BSI type (BSI being the acronym of back-side illumination), i.e., image sensors intended to be illuminated via a back side, conventionally have the advantage of being small in size.

In this type of conventional BSI sensor, color filters, which are typically red, green and blue, are placed on the surface that receives the light flux of each pixel, for example in the conventional Bayer pattern.

The original color of the light flux is extracted by weighting the detected signals typically using one red pixel, two green pixels and one blue pixel (Bayer pattern). In this type of color-extraction technique, only 25% of the red component, 25% of the blue component, and 50% of the green component of the light flux incident on the pixel is used. The amount of light absorbed by the filters may result in a loss in sensitivity of about 70%. Furthermore, the reconstruction of the original color may be of relatively poor fidelity.

Moreover, color-selection techniques based on absorption depth, which employ a superposition of p-n junctions, conventionally exhibit a large amount of thermal noise that is detrimental to the colorimetric reconstruction.

It would be desirable to improve the fidelity of the color reconstruction and the sensitivity of these image sensors while benefiting from a good signal-to-noise ratio and preventing artefacts such as aliasing and the moiré effect.

SUMMARY

In an embodiment, an image sensor intended to be illuminated via a back side of a semiconductor substrate, for example one made of silicon, said back side being opposite a front side of the substrate, comprises: at least one pixel comprising a plurality of, for example three, doped photosensitive regions that are superposed vertically in the substrate between the back side and the front side, each photosensitive region being laterally framed by a respective vertical annular gate, the image sensor including a control circuit configured to bias the vertical annular gates during an integration phase, so as to generate an electrostatic potential comprising potential wells in the central portion of the volume of each photosensitive region and a potential barrier at each interface between two neighboring photosensitive regions.

Thus, each pixel of the image sensor, for example, comprises three photosensitive regions at various distances from the back side that receives the light flux. The photogenerated charge will be circumscribed in the potential wells of the photosensitive regions in which this charge is generated. As the semiconductor substrate absorbs various colors of the light at various depths, each photosensitive region captures a different color. Thus, each pixel of the image sensor captures all of the colors of the light signal, without needing to use filters and therefore without a loss in the amount of light received. This not only improves the sensitivity of the image sensor, but also contributes to limiting artefacts.

Moreover, confining the photogenerated charge using the electrostatic potential of the photosensitive regions framed by the vertical annular gates makes it possible to not take up space in the volume of the photosensitive regions in which the charge photogeneration occurs. Furthermore, this back-side-illumination vertical-annular-gate pixel structure, especially when according to the embodiments defined below, is adaptable to so-called 4T read technologies employing correlated double sampling and suitable for integrating charge in a global-shutter mode, which is advantageous per se.

According to one embodiment, the dimensions of each vertical annular gate and the dopant concentrations of the photosensitive regions are conjointly configured to produce, in the electrostatic potential and via the action of said biasing voltages, said potential wells and said potential barriers.

According to one embodiment, the sensor further includes a vertical annular transfer gate between a read node next to the front side and the first photosensitive region on the side of the front side, and the control circuit is configured to bias said transfer gate so as to transfer photogenerated charge located in the potential well from the first photosensitive region to the read node, during a transfer phase.

Advantageously, each pixel further includes a read circuit configured to be controlled by the control circuit, each read circuit including a reset transistor and a source-follower transistor that are configured to generate a read signal by correlated double sampling of the charge on the read node, and a selection transistor that is configured to select a pixel and to transmit the read signal from the pixel over a read line.

This corresponds to a read circuit in the 4T technology mentioned above, i.e., a technology advantageously employing four transistors (here the vertical annular transfer gate, the reset transistor, the source-follower transistor and the selection transistor) to deliver the read signal representative of the amount of light detected.

According to one embodiment, the control circuit is further configured, in a transfer phase, to bias at least one vertical annular gate in order to lower the level of the respective potential well and the level of the respective potential barrier, so as to transfer photogenerated charge initially located in the photosensitive region on the other side of the lowered potential barrier to the photosensitive region the potential well of which has been lowered, then to bias said at least one vertical annular gate in order to raise said levels of the well and of the potential barrier to their initial levels.

As is conventional in the field of semiconductors and known to those skilled in the art, by potential well what is meant is an environment within the vicinity of a local minimum in the electrostatic potential energy of a charged particle, and by potential barrier what is meant is an environment in the vicinity of a local maximum in the electrostatic potential energy of a charged particle. Thus, the absolute levels of a potential well and of a potential barrier depend on the sign of the charge of the charged particle. If the photogenerated particles are positively charged, the potential of a well is lower than the potential of a barrier, whereas if the photogenerated particles are negatively charged, the potential of a well is higher than the potential of a barrier. Furthermore, by "lower the level", what is meant is decrease the electrostatic potential energy, especially in order to accentuate the potential-well effect localizing the charged particles, and by "raise" the level, what is meant is increase the electrostatic potential energy, especially in order to accentuate the potential-barrier effect impeding the charged particles.

In other words, this embodiment defines a mechanism for transferring the photogenerated charge from one photosensitive region to the next.

According to one embodiment, the control circuit comprises a color read-out mode, and is configured in the color read-out mode, in the transfer phase, to empty the photogenerated charge from the photosensitive regions by transferring this charge to the read node or to a photosensitive region emptied of charge, in order to gradually convey the photogenerated charge from each photosensitive region to the read node, the control circuit further being configured to sequentially read, from the read node, the charge separately photogenerated in each photosensitive region, for example by means of the read circuit such as defined above.

This embodiment corresponds to a separate read-out of the signals detected by each photosensitive region, especially allowing the original color of the received light to be recreated.

According to one embodiment, the control circuit comprises an intensity read-out mode, and is configured in the intensity read-out mode, in the transfer phase, to transfer the photogenerated charge from one photosensitive region to the next, in order to accumulate the charge of the photosensitive regions in the read node, the control circuit further being configured to read from the read node the sum of the charge photogenerated in all the photosensitive regions, for example by means of the read circuit such as defined above.

This embodiment corresponds to a simultaneous read-out of the signals detected by each photosensitive region, especially allowing the absolute intensity of the received light to be measured.

According to one embodiment, the plurality of photosensitive regions consists of three photosensitive regions, and, vertically, in the direction pointing from the front side to the back side, the first photosensitive region extends from a first depth to a second depth, the second photosensitive region extends from the second depth to a third depth, and the third photosensitive region extends from the third depth to a fourth depth; and, the third vertical annular gate extends from the front side to the fourth depth at least, the second vertical annular gate is concentrically inside the third vertical annular gate and extends from the front side to the third depth at least, and the first vertical annular gate is concentrically inside the second vertical annular gate and extends from the front side to the second depth at least.

Advantageously, the first vertical annular gate penetrates into a segment of the second photosensitive region to a depth larger than the second depth but smaller than the third depth, and the second vertical annular gate penetrates into a segment of the third photosensitive region to a depth larger than the third depth but smaller than the fourth depth.

According to another aspect, a method is provided for acquiring a light flux using at least one pixel of an image sensor intended to be illuminated via a back side of a semiconductor substrate incorporating said pixel, the back side being opposite a front side of the substrate, said at least one pixel comprising a plurality of doped photosensitive regions that are superposed vertically in the substrate between the back side and the front side, each photosensitive region being laterally framed by a respective vertical annular gate, the method comprising an integration phase comprising illuminating said back side with the light flux, and biasing the vertical annular gates so as to generate an electrostatic potential comprising potential wells in the central portion of the volume of each photosensitive region and a potential barrier at each interface between two neighboring photosensitive regions.

According to one mode of implementation, the method comprises providing said image sensor such that the dimensions of each vertical annular gate and the dopant concentrations of the photosensitive regions are conjointly configured to produce, in the electrostatic potential, and via the action of said biasing voltages, said potential wells and said potential barriers.

According to one mode of implementation, the method further comprises a transfer phase comprising biasing a vertical annular transfer gate, which is located between a read node next to the front side and the first photosensitive region on the side of the front side, so as to transfer photogenerated charge located in the potential well of the first photosensitive region to the read node in a transfer phase.

According to one mode of implementation, the method comprises a transfer phase further comprising biasing at least one vertical annular gate so as to lower the level of the respective potential well and the level of the respective potential barrier, so as to transfer photogenerated charge initially located in the photosensitive region on the other side of the lowered potential barrier to the photosensitive region the potential well of which has been lowered, then biasing said at least one vertical annular gate so as to raise said levels of the well and of the potential barrier to their initial levels.

According to one mode of implementation, in a color read-out mode, the transfer phase comprises emptying the photogenerated charge from the photosensitive regions by transferring this charge to the read node or to a photosensitive region emptied of charge, so as to gradually convey the photogenerated charge from each photosensitive region to the read node, and sequentially reading, from the read node, the charge separately photogenerated in each photosensitive region.

According to one mode of implementation, in an intensity read-out mode, the transfer phase comprises transferring the photogenerated charge from one photosensitive region to the next, gradually accumulating the photogenerated charge of the photosensitive regions in the read node, and reading from the read node the sum of the charge photogenerated in all the photosensitive regions.

BRIEF DESCRIPTION OF THE DRAWINGS

Other advantages and features of the invention will become apparent on examining the detailed description of completely non-limiting embodiments and modes of implementation, and the appended drawings, in which.

DETAILED DESCRIPTION

In all that follows, the term "substantially" means "to within 10%, and preferably to within 5%".

Figure 1:
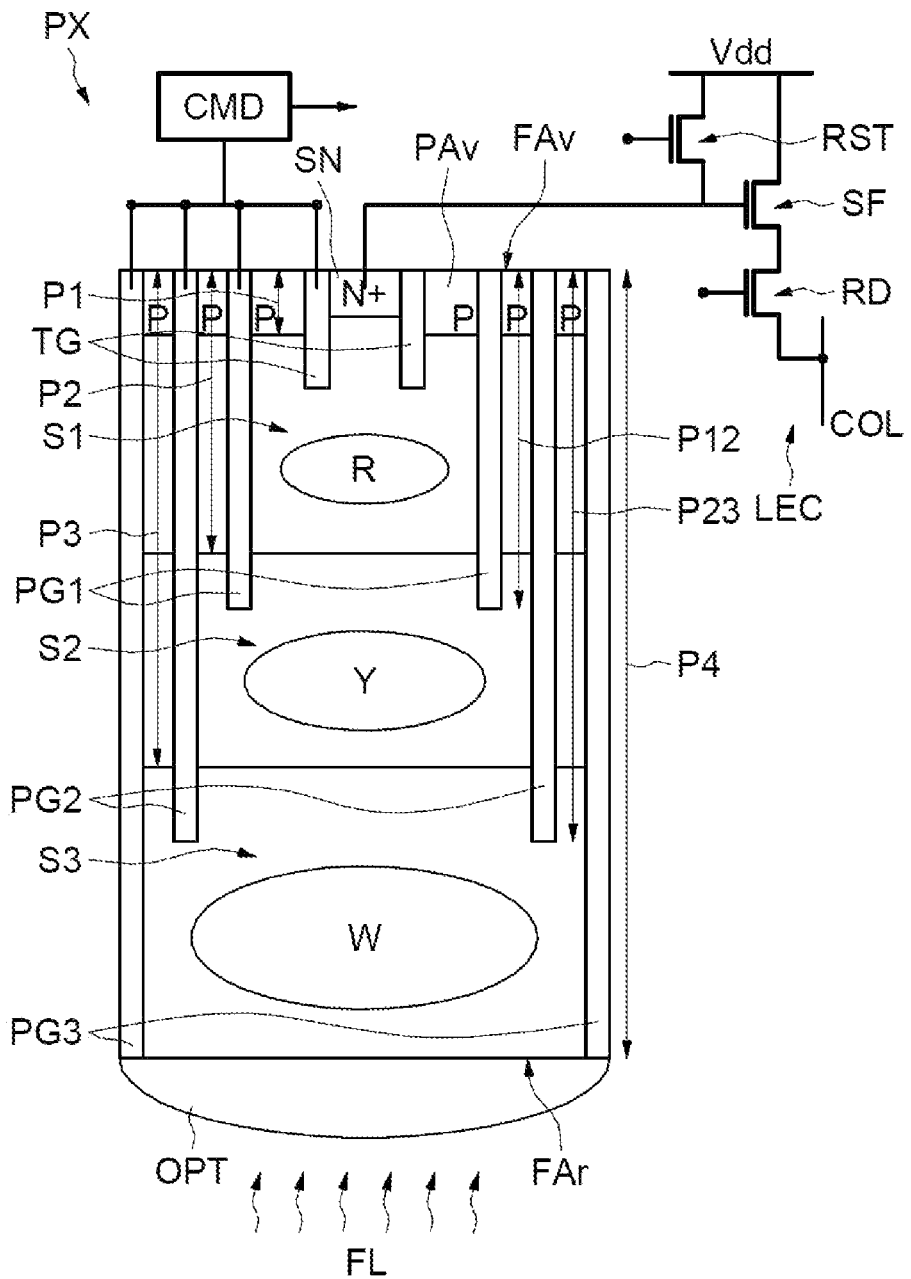
FIG. 1 shows a cross-sectional view of a pixel of an image sensor.

FIG. 1 shows a cross-sectional view of a pixel PX of an image sensor intended to be illuminated via the back side FAr.

The back side FAr is the side opposite the front side FAv of a semiconductor substrate incorporating said pixel PX. The front side FAv of the substrate conventionally designates the side on which the various devices of the circuits, such as conventionally transistors, capacitors and resistors, inter alia, are fabricated. The front side FAv of a substrate is the side of the substrate that belongs to the region usually referred to as the front end of line (FEOL), which generally includes the substrate and all the elements up to the first interconnect level of the region usually referred to as the back end of line (BEOL).

The pixel PX comprises a plurality of doped photosensitive semiconductor regions, three photosensitive regions S1, S2, S3 in the example of FIG. 1. The photosensitive regions are superposed vertically, and fill substantially the entire thickness of the substrate from the back side FAr to the front side FAv. The vertical direction is the direction perpendicular to the front side FAv and back side FAr of the substrate.

The first, second and third photosensitive regions are denoted S1, S2, S3, respectively, in their depthwise order vertically from the front side FAv to the back side FAr. The first photosensitive region S1 is therefore the closest to the front side FAv, whereas the third photosensitive region S3 is the furthest from the front side Fav, and the second photosensitive region S2 is located between the first and third photosensitive regions S1 and S3.

The photosensitive regions S1, S2, S3 are, for example, formed by epitaxial growth of silicon doped in situ or ex situ, one after the other. The first epitaxial growth operation causes the third photosensitive region S3 to grow on a surface of an initial carrier substrate (not shown). Optionally, the third photosensitive region S3 is formed by implanting dopants into the initial carrier substrate. The second epitaxial growth operation causes the second photosensitive region S2 to grow on the third photosensitive region S3, and the last epitaxial growth operation causes the first photosensitive region S1 to grow on the second photosensitive region S2.

Here and below, the example of n-type doping is chosen, but p-type doping could be envisaged if the conditions of control of the elements, such as described below especially with reference to FIGS. 3 to 6, were adapted to obtain the described effects.

Thus, in the structure which results, especially from epitaxial growth operations, the first photosensitive region S1 extends from a first depth P1 to a second depth P2, the second photosensitive region S2 extends from the second depth P2 to a third depth P3, and the third photosensitive region S3 extends from the third depth P3 to a fourth depth P4. The depths are measured from the front side FAv, which is located above the last epitaxially grown region.

Each photosensitive region S1, S2, S3 is laterally framed by a respective vertical annular gate PG1, PG2, PG3.

The vertical annular gates PG1, PG2, PG3 are fabricated using a CDTI (capacitor deep trench isolation) process comprising etching vertical trenches in the substrate, forming a dielectric layer, for example of silicon dioxide, on the sidewalls and bottom of the trenches, and filling the trenches with a conductive material, for example polysilicon, that is thus enveloped by the dielectric layer, which electrically insulates the electrode and substrate.

Next, in a way that is conventional in the fabrication of BSI pixels, after having formed various elements of the image sensor, for example the elements described below, and the BEOL interconnect portion, a silicon wafer forming a handle is bonded to the top surface of the BEOL interconnect portion and the device is thinned from the back side of the initial carrier substrate in order to achieve the structure shown.

An optical element OPT may be placed on the back side FAr thus obtained and configured to receive a light flux FL to be detected.

The vertical annular gates PG1, PG2, PG3 trace square rings on the front side FAv.

Figure 2:
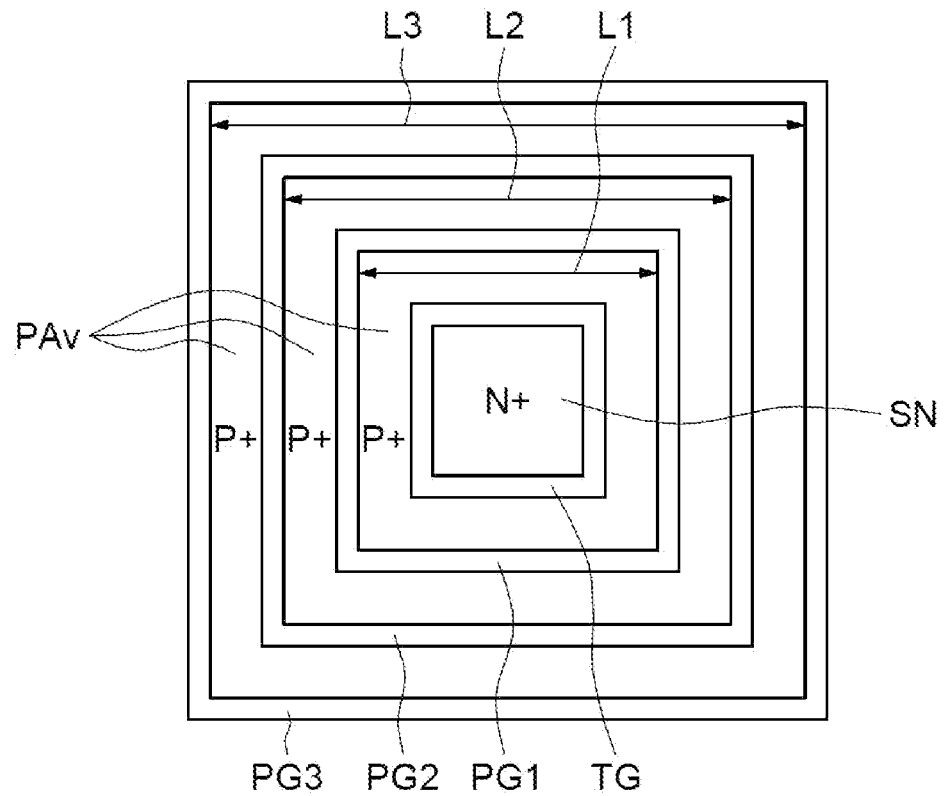
FIG. 2 shows a view from above of the front side of the pixel of FIG. 1.

In this respect, with reference to FIG. 2, there is shown a view from above of the front side FAv, containing the surfaces of the vertical annular gates PG1, PG2, PG3.

The vertical annular gates PG1, PG2, PG3 have concentric annular square shapes on the front side FAv, one inside the other depending on the depth of the photosensitive regions that they respectively frame. A vertical annular gate framing a photosensitive region is located inside a vertical annular gate framing a deeper photosensitive region.

Thus, the first width L1 of the first vertical annular gate PG1 is smaller than the second width L2 of the second vertical annular gate PG2 that itself is smaller than the third width L3 of the third vertical annular gate PG3. The widths considered here are the widths defined inside each square ring. For example, the first width L1 may be substantially 1.2 μm, the second width L2 may be substantially 2.0 μm and the third width may be substantially 2.8 μm.

Thus, the first vertical annular gate PG1 extends from the front side FAv to a depth P12 allowing the first photosensitive region S1 to be framed in its entirety, and is located inside the second vertical annular gate PG2. The second vertical annular gate PG2 extends from the front side FAv to a depth P23 allowing the second photosensitive region S2 to be framed in its entirety, and is located inside the third vertical annular gate PG3. The third vertical annular gate PG3 extends from the front side FAv to a depth P4 allowing the third photosensitive region S3 to be framed in its entirety (for example, up to within proximity to the back side Far).

Advantageously, the first vertical annular gate PG1 extends to a depth P12 larger than the second depth P2 but smaller than the third depth P3, or even smaller than one quarter of the distance between P2 and P3, so as to penetrate into a segment (or portion) of the second photosensitive region S2; and the second vertical annular gate PG2 extends to a depth P23 larger than the third depth P3 but smaller than the fourth depth P4, or even smaller than one quarter of the distance between P3 and P4, so as to penetrate into a segment (or portion) of the third photosensitive region S3.

Moreover, the pixel PX further includes a vertical annular transfer gate TG between a read node SN, i.e., an $n^+$ region located next to the front side FAv, and the first photosensitive region S1. A read circuit LEC forms, with the vertical annular transfer gate TG, a "4T" read technology, i.e., one employing four transistors. The read circuit LEC is configured to generate a correlated-double-sampling read signal from the charge on the read node SN. The read circuit LEC includes, to this end, a reset transistor RST coupled in series between a supply terminal Vdd and the read node SN, and a source-follower transistor SF controlled via the potential of the read node SN to generate a read signal representative of a measurement of the charge on the read node SN. The read circuit LEC includes a selection transistor RD configured to select the pixel PX and to transmit the read signal over a read line COL.

The correlated double sampling corresponds to a reset of the charge on the read node SN by the reset transistor RST, a first measurement of the charge on the reset read node SN, a transfer of the photogenerated charge to the read node SN and lastly a second measurement of the charge on the read node SN after transfer. The read signal is thus obtained by taking the difference between the first measurement and the second measurement.

A control circuit CMD is configured to bias said transfer gate TG so as to transfer photogenerated charge to the read node SN, in a transfer phase, and controls the read-out with the read circuit LEC.

During an integration phase, a light flux FL is received via said back side FAr, and the light flux FL entering into the photosensitive regions of the pixel PX firstly encounters the third photosensitive region S3, then, at a larger distance from the back side FAr, the second photosensitive region S2, and, even further from the back side FAr, the first photosensitive region S1.

Thus, various wavelengths are absorbed by the silicon depending on the distance travelled through the silicon of the photosensitive regions from the back side FAr.

For example, using the typical decomposition of the color of light into the three components red, green and blue, it is possible to consider that 25% of the red, 50% of the green and 100% of the blue are photo-converted in the third photosensitive region S3. The third photosensitive region S3 is thus dedicated to an approximately white color W. Similarly, it is possible to consider that 25% of the red and 50% of the green are photo-converted in the second photosensitive region S2, which is thus dedicated to an approximately yellow color Y. Lastly, 25% of the red is photo-converted in the first photosensitive region S1, which is thus dedicated to an approximately red color R.

With respect to the amount of light detected in each photosensitive region S1, S2, S3, knowledge of the exact distribution of the three components of the light in the three photosensitive regions S1, S2, S3 allows the original color of the input signal FL to be reconstructed.

The control circuit CMD is configured to bias the vertical annular gates PG1, PG2, PG3 during the integration phase, so that the photosensitive regions are fully depleted. For example, in the case where the photosensitive regions are weakly doped n-type, the vertical annular gates PG1, PG2, PG3 are biased with a slightly negative potential of −1 volt.

Figure 3:
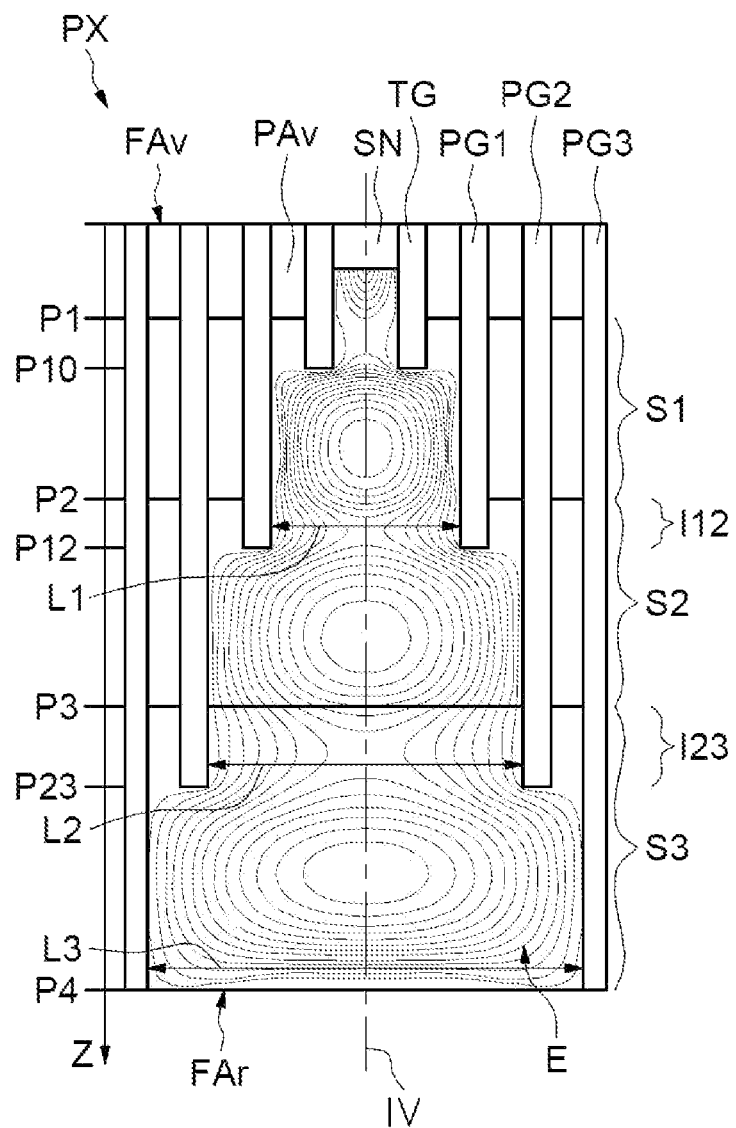
FIG. 3 shows lines of electrostatic equipotential in the cross-sectional view of FIG. 1 during an integration phase.
Figure 4:
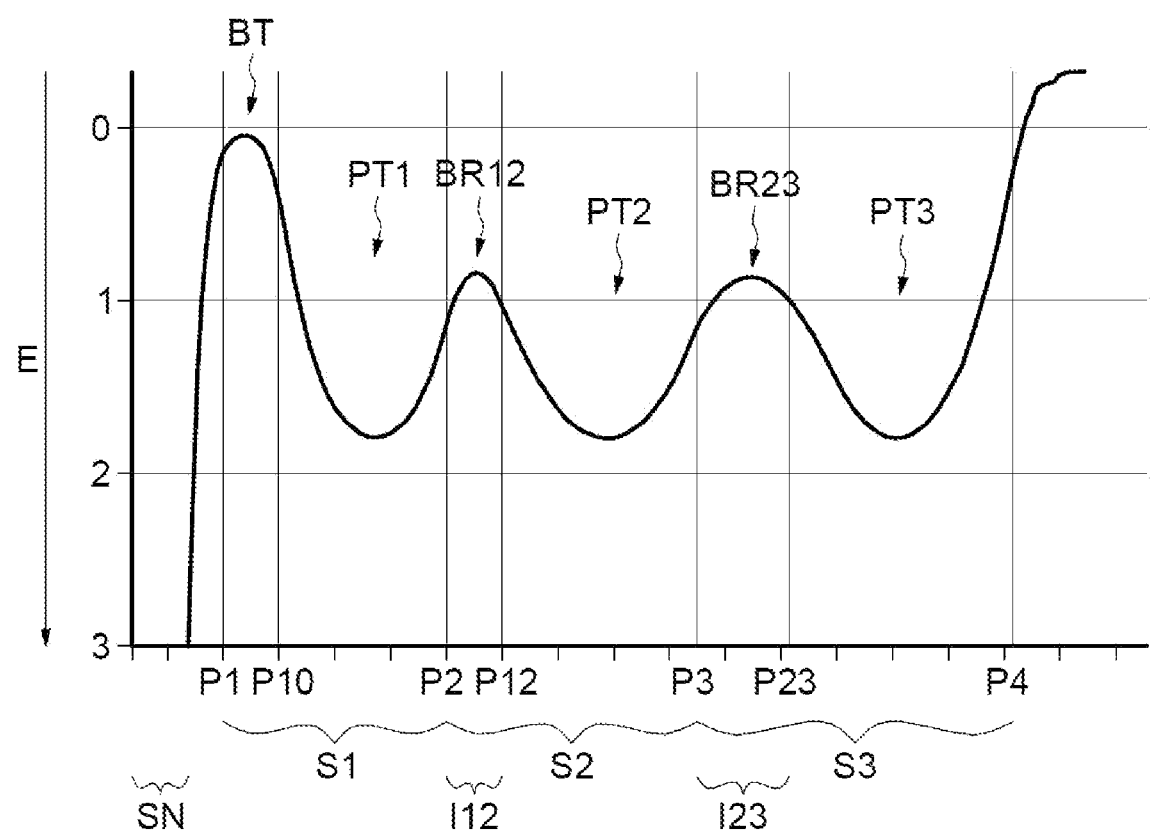
FIG. 4 shows the electrostatic potential along an axis IV that is vertical and centered on the middle of the pixel of FIG. 3.

Reference is now made to FIGS. 3 and 4. FIG. 3 shows lines of electrostatic equipotential E in the cross-sectional view of FIG. 1, during an integration phase. FIG. 4 shows the electrostatic potential E along an axis IV that is vertical Z and centered on the middle of the pixel PX of FIG. 3. The elements described above with reference to FIGS. 1 and 2 have been given the same references and are not detailed again.

The biasing voltage applied to the vertical annular gates PG1, PG2, PG3, for example −1 volt, produces an electrostatic potential E comprising potential wells PT1, PT2, PT3 in the central portion of the volume of each photosensitive region S1, S2, S3 and a potential barrier BR12, BR23 at each interface 112, 123 between two neighboring photosensitive regions.

The interfaces 112, 123 correspond to the segment of the second photosensitive region S2 into which the first vertical annular gate PG1 penetrates, and to the segment of the third photosensitive region S3 into which the second vertical annular gate PG2 penetrates, respectively.

Of course, it will be recalled that by "potential well" what is meant is an environment in the vicinity of a local minimum in the electrostatic potential energy of a charged particle, and by "potential barrier" what is meant is an environment in the vicinity of a local maximum in the electrostatic potential energy of a charged particle.

Thus, in the case where the fully depleted photosensitive regions S1, S2, S3 are doped n-type, the photogenerated particles that accumulate in the photosensitive regions are negatively charged electrons. Therefore, in absolute terms the potential of a well is greater than the potential of a barrier.

The values of electrostatic potential shown in FIG. 4, i.e. substantially 0.8 volts for the barriers BR12, BR23 and substantially 1.6 volts for the wells, are arbitrary values allowing embodiments and modes of implementation to be illustrated. The order of magnitude of these values, i.e. between 0 and 2 volts, is nevertheless correct for the example given below of the values of dopant concentrations and of the widths of the vertical annular gates.

The wells PT1, PT2, PT3 and the barriers BR12, BR23 in the electrostatic potential E are produced via the respective doping profiles of the fully depleted photosensitive regions S1, S2, S3, vis-à-vis the dimensions of the vertical annular gates PG1, PG2, PG3 and the action of the biasing voltage on the borders of the vertical annular gates PG1, PG2, PG3.

Specifically, the concentration of the dopants in the first photosensitive region S1 is configured to engender, in the fully depleted regime, a potential well PT1 in the central portion of the volume of the first photosensitive region S1, which region is framed by the first annular gate PG1 of width L1.

In parallel, the concentration of the dopants in the second photosensitive region S2 is configured to engender, in the fully depleted regime, both a potential barrier BR12 at the interface 112 framed by the first gate PG1 of width L1, and at the same time a potential well PT2 in the central portion of the volume of the second photosensitive region S2, which region is framed by the second annular gate PG2 of width L2.

Also in parallel, the concentration of the dopants in the third photosensitive region S3 is configured to engender, in the fully depleted regime, both a potential barrier BR23 at the interface 123 framed by the second gate PG2 of width L2, and at the same time a potential well PT3 in the central portion of the volume of the third photosensitive region S3, which region is framed by the third annular gate PG3 of width L3.

For example, such conditions may be obtained with a dopant concentration of substantially $5 \times 10^{15}$ cm$^{-3}$ in the first photosensitive region S1, of substantially $2 \times 10^{15}$ cm$^{-3}$ in the second photosensitive region S2, of substantially $1 \times 10^{15}$ cm$^{-3}$ in the third photosensitive region S3, and for a width L1 of substantially 1.2 μm, a width L2 of substantially 2.0 μm, and a width L3 of substantially 2.8 μm.

Thus, during an integration phase, the photogenerated electrons accumulate in the potential wells PT1, PT2, PT3, whereas the holes form a channel blanketing the walls of the vertical annular gates PG1, PG2, PG3, which are biased to a slightly negative potential. The holes could be evacuated, for example, via a p-doped evacuation region PAv located next to the front side FAv, and set to a ground potential (FIGS. 1 and 3). The evacuation region PAv for example includes a p-well set to ground potential by means of a contact connected to a p⁺ highly doped region (FIG. 2) of the well.

The bottom of the p-well of the evacuation region PAv, for example, defines the first depth P1 from which the first photosensitive region S1 starts.

Furthermore, the vertical annular gate TG, for example, penetrates into a segment (or portion) of the first photosensitive region S1, to a depth P10.

Furthermore, during the integration phase, the vertical annular transfer gate TG is set to a negative potential in order to generate a potential barrier BT between the first photosensitive region S1 and the read node SN, said barrier being substantially located between the depths P1 and P10.

After the integration phase, in a transfer phase, the vertical annular transfer gate TG will be set to a positive potential in order to lower the level of the potential barrier BT under the level of the potential well PT1 of the first photosensitive region, so as to transfer the charge photogenerated in the first photosensitive region to the read node SN.

Figure 5:
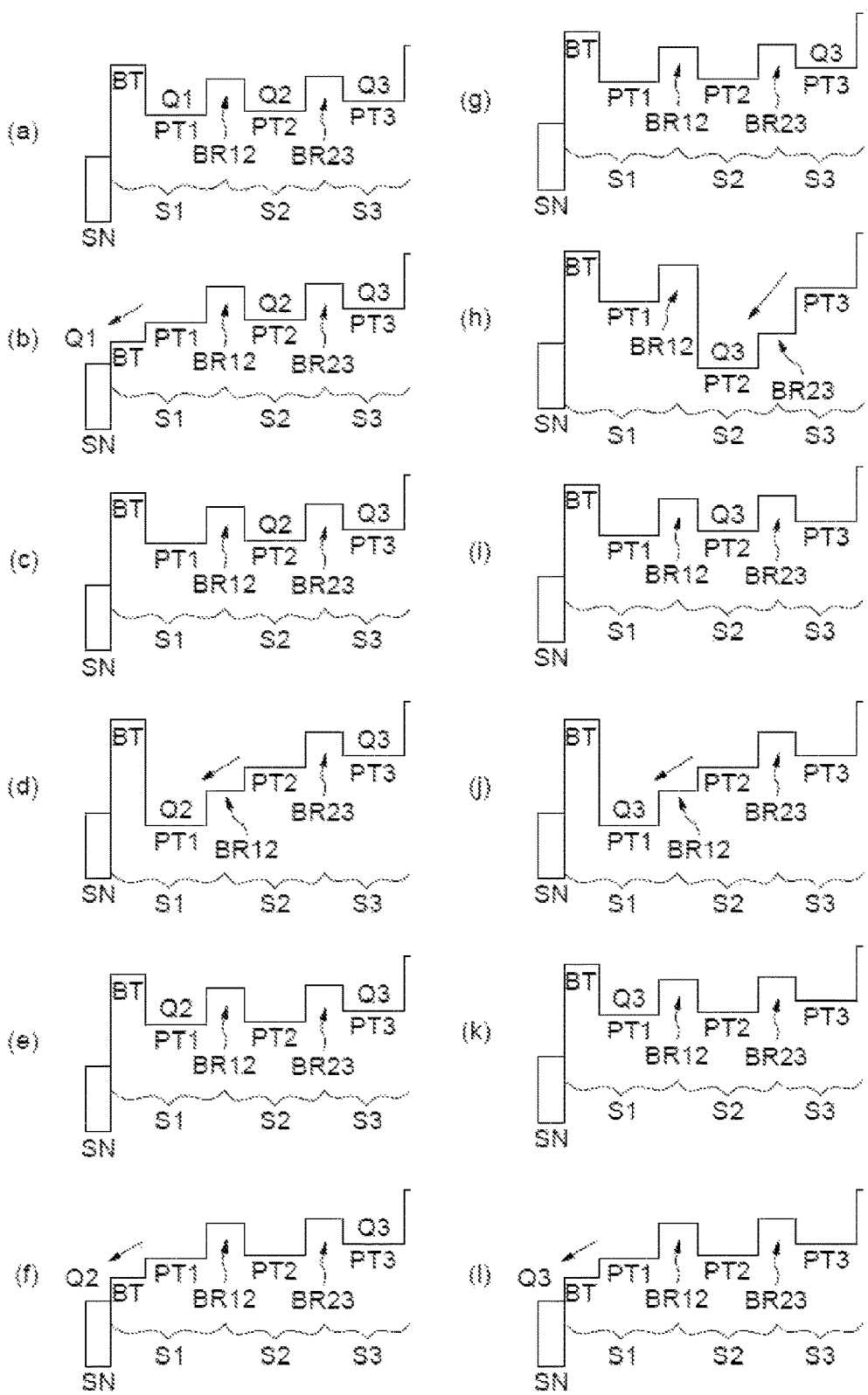
FIG. 5 schematically illustrates the potential curve of FIG. 4 in steps (a) to (l) of an example color read-out mode.
Figure 6:
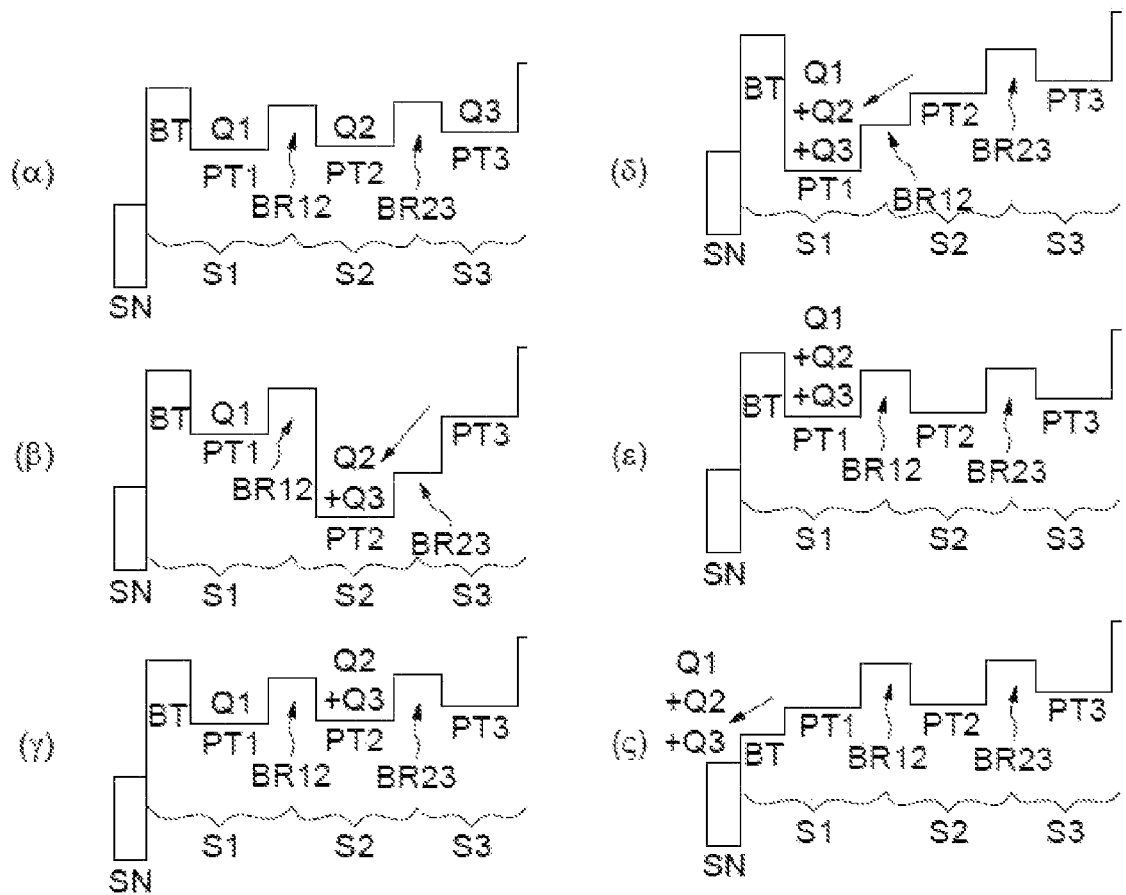
FIG. 6 schematically illustrates the potential curve of FIG. 4 in steps (α) to (ζ) of an example of an intensity read-out mode.

In this respect, reference is made to FIGS. 5 and 6 which illustrate two examples of read-out modes able to be implemented in the transfer phase.

FIG. 5 schematically illustrates the potential curve of FIG. 4 in steps (a) to (l) of an example color read-out mode for separately reading the charge photogenerated in each photosensitive region.

In an initial step (a) of the transfer phase, a first amount of photogenerated charge Q1 is accumulated in the first potential well PT1, a second amount of photogenerated charge Q2 is accumulated in the second potential well PT2, and a third amount of photogenerated charge Q3 is accumulated in the third potential well PT3.

In a step (b), the vertical annular transfer gate is positively biased so as to lower the barrier BT and empty the charge Q1 to the read node SN.

In step (c), the potential barrier BT is raised back to its initial level by applying a negative potential to the transfer gate TG, and a read-out of the first charge Q1 by the read circuit LEC may be commanded by the control circuit CMD.

Next, in step (d), the barrier BR12 is lowered by positively biasing the first vertical annular gate PG1, and the second charge Q2 is transferred from the second well PT2 to the first well PT1, the level of which is lower, and which was emptied beforehand of its charge in step (b).

Steps (e), (f), and (g) are analogous to steps (a), (b), and (c) but are used to transfer to the read node SN the second charge Q2 and to read it therefrom.

Next, in step (h), the barrier BR23 is lowered by positively biasing the second vertical annular gate PG2, and the third charge Q3 is transferred from the third well PT3 to the second well PT2, the level of which is lower, and which was emptied beforehand of its charge in step (f).

In step (i), the potential barrier BR23 is raised to its initial level by applying the negative potential to the third vertical annular gate PG3, in order to prevent a return of the third charge Q3 to the third well PT3.

Steps (j), (k), and (l) are analogous to steps (d), (e), and (f) but are used to transfer to the read node SN the third charge Q3.

After step (l), the potential barrier BT is raised to its initial level by applying a negative potential to the transfer gate TG, and with a view to reading the third charge Q3 from the read node (not shown).

In other words, the control circuit CMD is configured to empty the photogenerated charge Q1, Q2, Q3 from the photosensitive regions S1, S2, S3 by transferring the charge either to the read node SN or to a photosensitive region S1, S2 emptied of charge, so as to gradually convey, through the potential wells PT1, PT2, PT3, to the read node SN, the photogenerated charge Q1, Q2, Q3 of each photosensitive region S1, S2, S3.

The control circuit CMD and the read circuit LEC are further configured to sequentially read, from the read node SN, the charge separately photogenerated in each photosensitive region S1, S2, S3, when each charge Q1, Q2, Q3 reaches the read node SN.

Each charge transfer is controlled by the control circuit CMD, which is configured to bias the vertical annular gates PG1, PG2 to lower the level of the respective potential well and the level of the respective potential barrier. The photogenerated charge Q2, Q3 initially located in the photosensitive region S2, S3 on the other side of the lowered potential barrier is transferred to the photosensitive region S1, S2 the potential well of which is lowered. The levels of the well and of the potential barrier are then raised to their initial levels.

Of course, by "lower the level", what is meant is decrease the electrostatic potential energy, especially in order to accentuate the potential-well effect localizing the charged particles, and by "raise" the level, what is meant is increase the electrostatic potential energy, especially in order to accentuate the potential-barrier effect impeding the charged particles. Thus, in the case of photosensitive regions doped n-type, lowering the level of a well or of a barrier amounts to increasing the electrostatic potential thereof, and raising the level of a well or of a barrier amounts to decreasing the electrostatic potential thereof.

FIG. 6 schematically illustrates the potential curve of FIG. 4 in steps (α) to (ζ) of an example of an intensity read-out mode for reading the sum of the charge photogenerated in all the photosensitive regions.

In an initial step (α) of the transfer phase, a first amount of photogenerated charge Q1 is accumulated in the first potential well PT1, a second amount of photogenerated charge Q2 is accumulated in the second potential well PT2, and a third amount of photogenerated charge Q3 is accumulated in the third potential well PT3.

In step (β), a positive potential is applied to the second vertical annular gate PG2 in order to lower the level of the barrier BR23 and of the second well PT2, transferring the third charge Q3 to the second well PT2 containing the second charge Q2. Thus, the sum Q2+Q3 of the second and third charge is accumulated in the second well PT2.

In step (γ), the second vertical annular gate PG2 is negatively biased in order to raise the level of the barrier BR23.

Next, in step (δ), a positive potential is applied to the first vertical annular gate PG1 in order to lower the level of the barrier BR12 and of the first well PT1, transferring the sum Q2+Q3 of the second and third charge to the first well PT1 containing the first charge Q1. Thus, the sum Q1+Q2+Q3 of the first, second and third charge is accumulated in the first well PT1.

In step (ε), the first vertical annular gate PG1 is negatively biased in order to raise the level of the barrier BR12.

Next, in step (ζ), the vertical annular transfer gate TG is positively biased so as to lower the barrier BT and empty the sum Q1+Q2+Q3 of the charge to the read node SN.

In other words, in the intensity read-out mode, the control circuit CMD is configured to transfer the photogenerated charge Q1, Q2, Q3 from one photosensitive region to the next S1, S2, S3, in order to accumulate the charge of the photosensitive regions in the read node SN.

The control circuit CMD and the read circuit LEC are further configured to read from the read node SN the sum Q1+Q2+Q3 of the charge photogenerated in all the photosensitive regions S1, S2, S3.

Moreover, the invention is not limited to these embodiments but encompasses any variant thereof; for example, the sequences of the color and intensity read-out modes may of course vary from the examples presented with reference to FIGS. 5 and 6, or indeed, embodiments in which the photosensitive regions are doped p-type are envisageable, with a control circuit suitable for generating signals having equivalent effects to those described above in a p-type semiconductor.

The invention claimed is:

1. An image sensor, comprising:
a semiconductor substrate having a back side intended to be illuminated and a front side opposite the back side;
a pixel comprising a plurality of doped photosensitive regions that are superposed vertically in the semiconductor substrate between the back side and the front side;
wherein said plurality of doped photosensitive regions include a first doped photosensitive region and a second doped photosensitive region;
a vertical annular transfer gate which laterally frames an upper portion of the first doped photosensitive region;
a first vertical annular gate which surrounds the vertical annular transfer gate and laterally frames a lower portion of the first doped photosensitive region;
a second vertical annular gate which surrounds the first vertical annular gate and laterally frames the second doped photosensitive region; and
a control circuit configured to bias the vertical annular transfer gate and the first and second vertical annular gates during an integration phase so as to generate an electrostatic potential comprising potential wells in the central portion of the volume of each doped photosensitive region and a potential barrier at each interface between two neighboring doped photosensitive regions.

2. The image sensor according to claim 1, wherein dimensions of each vertical annular gate and a dopant concentration of each doped photosensitive region are conjointly configured to produce, in the electrostatic potential and via the action of said biasing voltages, said potential wells and said potential barriers.

3. The image sensor according to claim 1, wherein the vertical annular transfer gate extends between a doped read node at the front side and the lower portion of the first doped photosensitive region, wherein the control circuit is configured to bias said vertical annular transfer gate so as to transfer photogenerated charge located in the potential well of the lower portion of the first doped photosensitive region through the upper portion of the first doped photosensitive region to the doped read node during a transfer phase.

4. The image sensor according to claim 3, wherein the pixel further includes a read circuit configured to be controlled by the control circuit, the read circuit including a reset transistor and a source-follower transistor that are configured to generate a read signal by correlated double sampling of charge on the doped read node, and a selection transistor that is configured to transmit the read signal from the pixel to a read line.

5. The image sensor according to claim 1, wherein the control circuit is further configured, in a transfer phase, to bias at least one vertical annular gate in order to lower a level of the respective potential well and a level of the respective potential barrier from initial levels, so as to transfer photogenerated charge initially located in one doped photosensitive region of said plurality of doped photosensitive regions on the other side of the lowered potential barrier to another doped photosensitive region of said plurality of doped photosensitive regions where the potential well has been lowered, and then to bias said at least one vertical annular gate in order to raise said level of the respective potential well and the level of the respective potential barrier to said initial levels.

6. The image sensor according to claim 5, wherein the control circuit comprises a color read-out mode and is configured in the color read-out mode, in the transfer phase, to empty the photogenerated charge from the plurality of doped photosensitive regions by transferring said photogenerated charge to one of a read node or a doped photosensitive region emptied of charge, in order to gradually convey the photogenerated charge from each doped photosensitive region to the read node, the control circuit further being configured to sequentially read, from the read node, the separately photogenerated charge in each doped photosensitive region.

7. The image sensor according to claim 5, wherein the control circuit comprises an intensity read-out mode and is configured in the intensity read-out mode, in the transfer phase, to transfer photogenerated charge from one doped photosensitive region of said plurality of doped photosensitive regions to another doped photosensitive region of said plurality of doped photosensitive regions in order to accumulate the photogenerated charges from the doped photosensitive regions in the read node, the control circuit further being configured to read from the read node a sum of the photogenerated charges from all of the doped photosensitive regions.

8. An image sensor, comprising:
a semiconductor substrate having a back side intended to be illuminated and a front side opposite the back side;
a pixel comprising a plurality of doped photosensitive regions that are superposed vertically in the semiconductor substrate between the back side and the front side;
wherein said plurality of doped photosensitive regions includes three doped photosensitive regions, and wherein said three doped photosensitive regions are arranged, vertically, in a direction from the front side to the back side, with a first doped photosensitive region extending from a first depth to a second depth, a second doped photosensitive region extending from the second depth to a third depth, and a third doped photosensitive region extending from the third depth to a fourth depth;
a respective vertical annular gate which laterally frames each doped photosensitive region; and
a control circuit configured to bias the vertical annular gates during an integration phase so as to generate an electrostatic potential comprising potential wells in the central portion of the volume of each doped photosensitive region and a potential barrier at each interface between two neighboring doped photosensitive regions.

9. The image sensor according to claim 8, wherein the vertical annular gates include a third vertical annular gate extending from the front side to at least the fourth depth, a second vertical annular gate located concentrically inside the third vertical annular gate and extending from the front side to at least the third depth, and a first vertical annular gate located concentrically inside the second vertical annular gate and extending from the front side to at least the second depth.

10. The sensor according to claim 9, wherein the first vertical annular gate penetrates into a segment of the second doped photosensitive region with a depth larger than the second depth but smaller than the third depth, and wherein the second vertical annular gate penetrates into a segment of the third doped photosensitive region with a depth larger than the third depth but smaller than the fourth depth.

11. The sensor according to claim 8, wherein the first doped photosensitive region is doped with a first dopant level concentration, the second doped photosensitive region is doped with a second dopant level concentration less than the first dopant level concentration, and the third doped photosensitive region is doped with a third dopant level concentration less than the second dopant level concentration.

12. The image sensor according to claim 8, wherein dimensions of each vertical annular gate and a dopant concentration of each doped photosensitive region are conjointly configured to produce, in the electrostatic potential and via the action of said biasing voltages, said potential wells and said potential barriers.

13. The image sensor according to claim 8, further including a vertical annular transfer gate between a doped read node at the front side and a first doped photosensitive region of said plurality of doped photosensitive regions, wherein the control circuit is configured to bias said vertical annular transfer gate so as to transfer photogenerated charge located in the potential well of the first doped photosensitive region to the doped read node during a transfer phase.

14. The image sensor according to claim 13, wherein the pixel further includes a read circuit configured to be controlled by the control circuit, the read circuit including a reset transistor and a source-follower transistor that are configured to generate a read signal by correlated double sampling of charge on the doped read node, and a selection transistor that is configured to transmit the read signal from the pixel to a read line.

15. An image sensor, comprising:
a semiconductor substrate having a back side and a front side opposite the back side;
a plurality of doped photosensitive regions that are superposed vertically in the semiconductor substrate between the back side and the front side;
wherein said plurality of doped photosensitive regions include a first doped photosensitive region and a second doped photosensitive region;
a vertical annular transfer gate which laterally frames an upper portion of the first doped photosensitive region;
a first vertical annular gate which surrounds the vertical annular transfer gate and laterally frames a lower portion of the first doped photosensitive region;
a second vertical annular gate which surrounds the first vertical annular gate and laterally frames the second doped photosensitive region; and
a control circuit configured to bias the vertical annular transfer gate and first and second vertical annular gates during an integration phase.

16. The image sensor according to claim 15, further comprising an image receiving lens mounted to the back side of said semiconductor substrate.

17. The image sensor according to claim 15, further including:
a doped read node at the front side; and
wherein the vertical transfer gate extends between the doped read node and the lower portion of the first doped photosensitive region;
wherein the control circuit is further configured to bias said vertical transfer gate during a transfer phase.

18. The image sensor according to claim 17, further including:
a read circuit;
wherein the control circuit is further configured to control the read circuit during a read phase.

19. The image sensor according to claim 18, wherein the read phase includes a generation of a read signal by correlated double sampling of charge on the doped read node.

20. An image sensor, comprising:
a semiconductor substrate having a back side and a front side opposite the back side;
a plurality of doped photosensitive regions that are superposed vertically in the semiconductor substrate between the back side and the front side;
wherein said plurality of doped photosensitive regions includes three doped photosensitive regions vertically arranged from the front side to the back side; and
a respective vertical annular gate which laterally frames each doped photosensitive region; and
a control circuit configured to bias the vertical annular gates during an integration phase.

21. The image sensor according to claim 20, wherein a first doped photosensitive region of said three doped photosensitive regions extends from a first depth to a second depth, and wherein the vertical annular gates include a first vertical annular gate extending from the front side to at least the second depth.

22. The image sensor according to claim 21, wherein a second doped photosensitive region of said three doped photosensitive regions extends from the second depth to a third depth, and wherein the vertical annular gates include a second vertical annular gate located concentrically outside the first vertical annular gate and extending from the front side to at least the third depth.

23. The sensor according to claim 22, wherein the first vertical annular gate penetrates into a segment of the second doped photosensitive region with a depth larger than the second depth but smaller than the third depth.

24. The image sensor according to claim 22, wherein a third doped photosensitive region of said three doped photosensitive regions extends from the third depth to a fourth depth, and wherein the vertical annular gates include a third vertical annular gate located concentrically outside the second vertical annular gate and extending from the front side to at least the fourth depth.

25. The sensor according to claim 24, wherein the second vertical annular gate penetrates into a segment of the third doped photosensitive region with a depth larger than the third depth but smaller than the fourth depth.

26. The sensor according to claim 20, wherein the three doped photosensitive regions are doped with different dopant level concentrations.

27. The image sensor according to claim 20, further comprising an image receiving lens mounted to the back side of said semiconductor substrate.

28. The image sensor according to claim 20, further including:
- a doped read node at the front side; and
- a vertical transfer gate between the doped read node and a first doped photosensitive region of said plurality of doped photosensitive regions;
- wherein the control circuit is further configured to bias said vertical transfer gate during a transfer phase.

29. The image sensor according to claim 28, further including:
- a read circuit;
- wherein the control circuit is further configured to control the read circuit during a read phase.

30. The image sensor according to claim 29, wherein the read phase includes a generation of a read signal by correlated double sampling of charge on the doped read node.

\* \* \* \* \*